United States Patent
Fan et al.

(10) Patent No.: US 6,632,700 B1
(45) Date of Patent: Oct. 14, 2003

(54) METHOD TO FORM A COLOR IMAGE SENSOR CELL WHILE PROTECTING THE BONDING PAD STRUCTURE FROM DAMAGE

(75) Inventors: Yang-Tung Fan, Jubei (TW);
Cheng-Yu Chu, Hsinchu (TW);
Chiou-Shian Peng, Hsinchu (TW);
Shih-Jane Lin, Hsinchu (TW);
Yen-Ming Chen, Hsinchu (TW);
Fu-Jier Fan, Jubei (TW); Kuo-Wei Lin, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 88 days.

(21) Appl. No.: 10/135,096

(22) Filed: Apr. 30, 2002

(51) Int. Cl.⁷ ............................................. H01L 21/00
(52) U.S. Cl. ..................................................... 438/70
(58) Field of Search ............................. 438/70, 98, 57, 438/48, 800, 612, 637, 704, 738, 69

(56) References Cited

U.S. PATENT DOCUMENTS

| | | | |
|---|---|---|---|
| 5,508,229 A | 4/1996 | Baker | 437/183 |
| 5,565,378 A * | 10/1996 | Harada et al. | 228/180.5 |
| 5,719,087 A | 2/1998 | Chen et al. | 438/612 |
| 5,807,787 A | 9/1998 | Fu et al. | 438/623 |
| 6,344,369 B1 * | 2/2002 | Huang et al. | 438/612 |

OTHER PUBLICATIONS

Japanese Abstract (JPAB) publication No. JP363269541A. Nec Corp. Sakume, Toshiyuki; Tomita, Yutaka Nov. 7, 1988. (abstract only).*

* cited by examiner

Primary Examiner—Craig Thompson
(74) Attorney, Agent, or Firm—George O. Saile; Stephen B. Ackerman; Douglas R. Schnabel (57) ABSTRACT

A new method to form color image sensor cells without damaging bonding pads in the manufacture of an integrated circuit device is achieved. The method comprises, first, forming cell electrodes and bonding pads on a semiconductor substrate. A passivation layer is formed overlying the cell electrodes but exposing the top surface of the bonding pads. The semiconductor substrate is then dipped in a hydrogen peroxide solution to thereby form a metal oxide layer overlying the bonding pads. A first transparent planarization layer is deposited overlying the passivation layer and the metal oxide layer. A color filter photoresist layer is deposited overlying the first transparent planarization layer. The color filter photoresist layer is patterned to form color filter elements to complete the color image sensor cells in the manufacture of the integrated circuit device. The presence of the metal oxide layer prevents damage to the bonding pads from an alkaline developer.

20 Claims, 6 Drawing Sheets

METHOD TO FORM A COLOR IMAGE SENSOR CELL WHILE PROTECTING THE BONDING PAD STRUCTURE FROM DAMAGE

BACKGROUND OF THE INVENTION (1) Field of the Invention

The invention relates to a method of fabricating semiconductor structures, and more particularly, to a method to form a color image sensor device while protecting the bonding pad structure in the manufacture of an integrated circuit device.

(2) Description of the Prior Art

Color image sensors are an important device in the art of integrated circuits. A color image sensor combines cell electrodes with color filtering elements. In a typical color image sensor cell, the cell electrodes comprise a patterned metal layer. The color filter elements are formed overlying the cell electrodes with a transparent layer therebetween. The color filter elements permit light transmission of particular wavelengths, for example, green, red and blue light. The color filter elements each comprise a patterned photosensitive, organic photoresist material. Bonding pad structures are used in the color image sensor integrated circuit to provide electrical connectivity outside the circuit. Unfortunately, it is found that the processes used to pattern the color filter elements can negatively effect the performance of the bonding pad structures.

Figure 1:
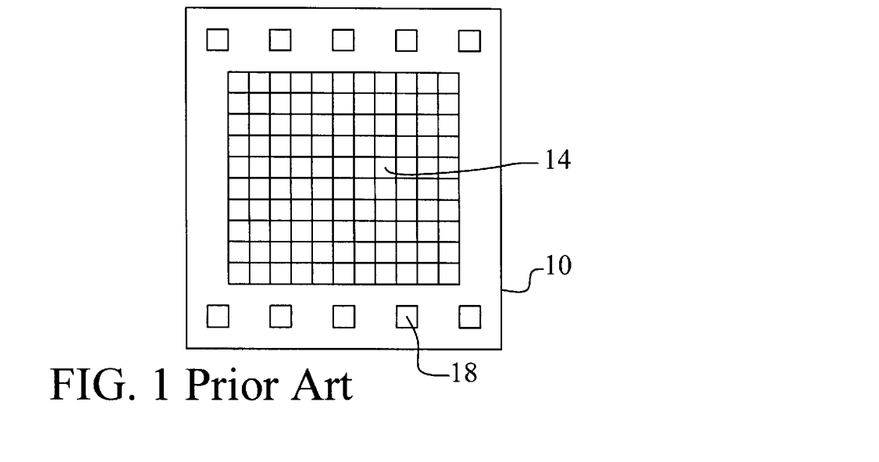
FIGS. 1 illustrates a top view of a prior art color image sensor integrated circuit device die.

Referring now to FIG. 1, a prior art color image sensor integrated circuit die 10 is illustrated. The integrated circuit die 10 is fabricated on a semiconductor substrate. A color image sensor array is formed in the interior of the die 10. The array is formed of a large matrix of individual cells 14. Bonding pad structures 18 are formed on the periphery of the die 10 to provide of-chip connectivity.

Figure 2:
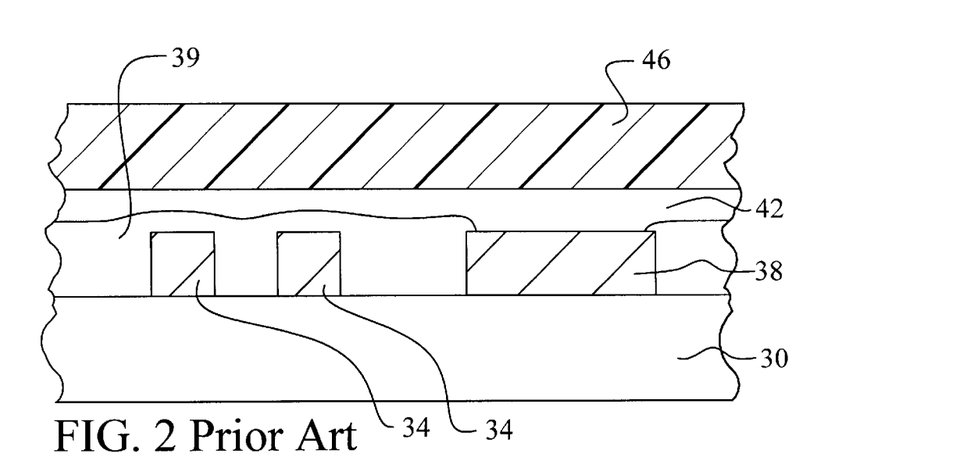
FIGS. 2 through 3 illustrate in cross section the prior art color image sensor circuit wherein the bonding pad structure is damaged in the color filter process.

Referring now to FIG. 2, a cross section of a simplified, color image sensor cell is shown. The semiconductor substrate 30 typically comprises monocrystalline silicon. Two types of metal structures 34 and 38 are formed overlying the semiconductor substrate 30. Cell electrodes 34 and bonding pad structures 38 are formed by patterning a metal layer. As shown in the top view of the circuit die, the cell electrodes 34 and the bonding pad structures 38 are typically formed in two different regions of the circuit. A passivation layer 39 and a transparent planarization layer 42 are deposited overlying the cell electrodes 34 and bonding pad structures 38. A photosensitive, organic photoresist layer 46 is applied overlying the transparent planarization layer 42.

Figure 3:
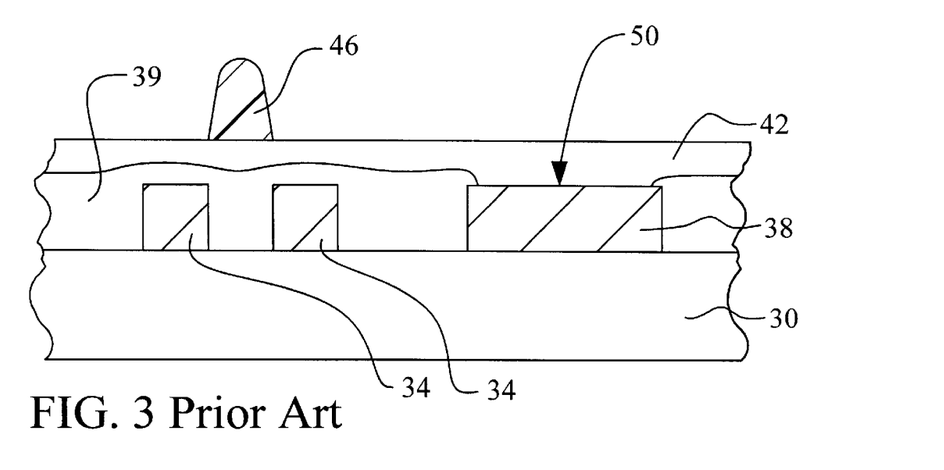

Referring now to FIG. 3, the photoresist layer 46 is patterned to form a color element 46 such as, for example, a green pixel. The photoresist layer 46 is patterned using a photolithographic mask exposure and development sequence. Of particular importance, the developer solution can penetrate 50 the planarization layer 42 and interact with the bonding pad structures 38. The developer can cause damage that is commonly called staining. Bonding pad staining causes yield and reliability problem. Wire bondability, as measured by bonding strength, is reduced by the staining caused by the color filter developer.

Several prior art inventions describe methods to form bonding pads. U.S. Pat. No. 5,719,087 to Chen et al teaches a method to prevent electrochemical damage to bonding pad surfaces during a passivation etch. A capping layer of PECVD oxide is deposited overlying the bonding pad prior to the passivation layer deposition. U.S. Pat. No. 5,807,787 to Fu et al discloses a method to reduce pad to pad leakage current. After polyimide layer patterning and plasma ashing, a thermal treatment is performed on the passivation layer to reduce leakage current. U.S. Pat. No. 5,565,378 to Harada et al teaches a method to form a passive state film on the surface of a bonding pad. The wafer is immersed in an ozone-containing solution to thereby form an aluminum oxide film that does not contain pinholes. The passive state film protects the bonding pad from water intrusion. U.S. Pat. No. 5,508,229 to Baker discloses a method to form solder bumps in an integrated circuit device. Solder is deposited through a mask onto a metal layer. The metal layer not covered by the solder is then etched away. An etching solution comprising phosphoric acid, de-ionized water, acetic acid, and hydrogen peroxide is used.

SUMMARY OF THE INVENTION

A principal object of the present invention is to provide an effective and very manufacturable method to form color image sensor cells and bonding pad structures in the manufacture of an integrated circuit device.

A further object of the present invention is to form a metal oxide layer overlying the bonding pads structures to protect the bonding pad from damage due to the color filter element developer.

A yet further object of the present invention is to. form the metal oxide layer overlying the bonding pads by dipping the integrated circuit wafer into a hydrogen peroxide solution.

Another further object of present invention is to improve the bondability of bonding pads in an integrated circuit device containing color filter elements.

Another further object of the present invention is to provide a method that will work with bonding pads comprising any of aluminum, aluminum alloys, and copper.

In accordance with the objects of this invention, a method to form color image sensor cells without damaging bonding pads in the manufacture of an integrated circuit device is achieved. The method comprises, first, forming cell electrodes and bonding pads on a semiconductor substrate. A passivation layer is formed overlying the cell electrodes but exposing the top surface of the bonding pads. The semiconductor substrate is then dipped in a hydrogen peroxide solution to thereby form a metal oxide layer overlying the bonding pads. A first transparent planarization layer is deposited overlying the passivation layer and the metal oxide layer. A color filter photoresist layer is deposited overlying the first transparent planarization layer. The color filter photoresist layer is patterned to form color filter elements to complete the color image sensor cells in the manufacture of the integrated circuit device. The presence of the metal oxide layer prevents damage to the bonding pads from an alkaline developer.

BRIEF DESCRIPTION OF THE DRAWINGS

In the accompanying drawings forming a material part of this description, there is shown.

DESCRIPTION OF THE PREFERRED EMBODIMENTS

The preferred embodiment discloses the application of the method of the present invention to the formation of color image sensor integrated circuit devices wherein damage to bonding pad structures is eliminated in the color filter process through the novel formation of a protective aluminum oxide layer overlying the bonding pad structures. It should be clear to those experienced in the art that the present invention can be applied and extended without deviating from the scope of the present invention.

Figure 4:
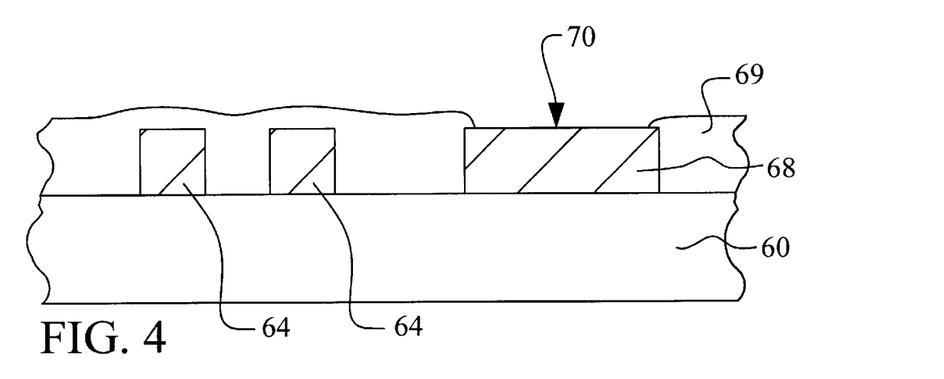
FIGS. 4 through 11 illustrate in cross section the preferred embodiment of the present invention.

Referring now particularly to FIG. 4, there is shown a cross section of a partially completed integrated circuit device. A semiconductor substrate 60 is provided. To simplify the illustration, the semiconductor substrate 60 is shown as a homogeneous entity. In practice, the semiconductor substrate 60 will comprise a plurality of devices, layers, interconnects, and isolations that make up the circuit. The semiconductor substrate 60 is shared between many individual circuit die on the semiconductor wafer. Preferably, the semiconductor substrate comprises monocrystalline silicon.

Metal structures 64 and 68 are formed overlying the semiconductor substrate 60. These metal structures comprise metal cell electrodes 64 and bonding pad structures 68. These metal structures 64 and 68 may be located entirely on the semiconductor substrate 60 or overlying a portion of the semiconductor substrate 60 or in an opening in an insulating layer which is formed on the semiconductor substrate 60. The insulating layer and the opening in the semiconductor substrate 60 are not shown in the illustration. Preferably, metal structures 64 and 68 are formed of a common metal layer. At a minimum, the bonding pad structures 68 must comprise metal layer that can be converted into metal oxide by exposure to hydrogen peroxide solution. This is a critical requirement of the present invention so that a metal oxide layer can be formed overlying the bonding pads 68. For example, the bonding pad structures 68 may comprise either aluminum, aluminum-copper alloys, aluminum-copper-silicon alloys, or copper. The most preferred composition of the bonding pads is alumimum-containing.

Cell electrodes 64 are formed where the color image sensor array is planned. The cell electrodes 64 constitute picture elements of the array. The bonding pads 68 are, typically, on the periphery of the device. The cell electrodes 64 and the bonding pads 68 are preferably formed by first depositing a metal layer. This metal layer is patterned using a conventional photolithography and etch sequence wherein a photoresist layer, not shown, is applied and patterned by exposure and development. This patterned photoresist layer is then used as a mask for etching the metal layer. In the case wherein separate metal layers are used for the cell electrodes 64 and the bonding pads 68, the photolithography and etch sequence will be repeated for each layer.

As an important feature, a passivation layer 69 is formed overlying the cell electrodes 64 but exposing the top surface of the bonding pads 68. The passivation layer 69 comprises, for example, a silicon nitride or a silicon oxide layer that is deposited using chemical vapor deposition. The passivation layer 69 is patterned, preferably by a photolithographic process as outlined above, to reveal the top surfaces of the bonding pads 68 as shown.

Figure 5:
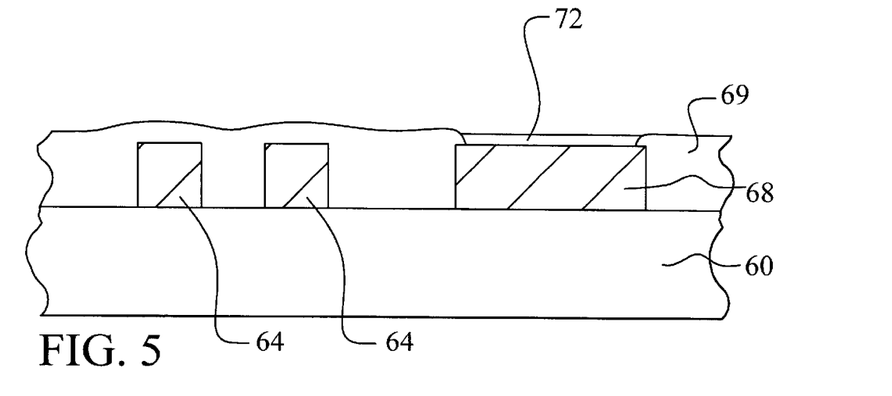

Referring now to FIG. 5, an important feature of the present invention is illustrated. The semiconductor substrate 60 is dipped in a hydrogen peroxide ($H_2O_2$) solution to thereby form a metal oxide layer 72 overlying the bonding pads 68. Depending on the composition of the bonding pads 68, the metal oxide may comprise, for example, aluminum oxide or copper oxide. In the most preferred case, the metal oxide layer 72 comprises aluminum oxide form from the reaction of the hydrogen peroxide solution and the aluminum-containing bonding pad 68. The metal oxide layer 72 thus formed serves as a protective barrier for the bonding pads 68 during the subsequent color filter process. By forming this protective barrier prior to the formation of the light transmitting elements, the performance of the color image sensor is not affected.

The hydrogen peroxide ($H_2O_2$) molecules oxidize the metal in the bonding pad structure 68 to cause the formation of the metal oxide layer 72 comprising, for example, aluminum oxide ($Al_2O_3$)The hydrogen peroxide solution preferably comprises a solution of hydrogen peroxide and water with a concentration of between about 1:10 and 1:12. In the dipping process, the entire semiconductor wafer is immersed in the hydrogen peroxide solution for between about 15 minutes and 20 minutes. During this reaction, the metal oxide layer 72 is formed overlying the surface of the bonding pads 68 to a thickness of between about 60 Angstrom and 100 Angstroms.

Figure 6:
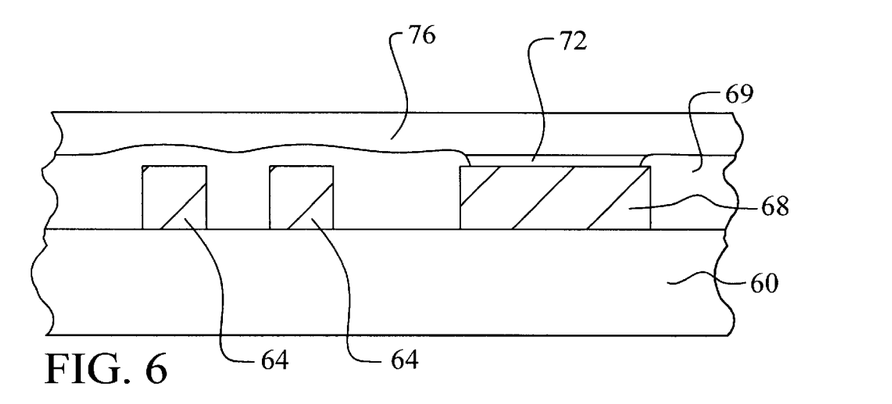

Referring now to FIG. 6, a first transparent planarization layer 76 is deposited overlying the passivation layer 69 and the metal oxide layer 72. The first transparent planarization layer serves two purposes in the fabrication process. First, the planarization layer 76 creates a planar surface for the formation of the color filter elements. Second, since the planarization layer 76 comprises a transparent material, light can pass through the color filter elements and strike the cell electrodes 64. The first transparent planarization layer 76 preferably comprises a photosensitive, transparent photoresist material that is deposited to a thickness of between about 1 micron and 2 microns.

Figure 7:
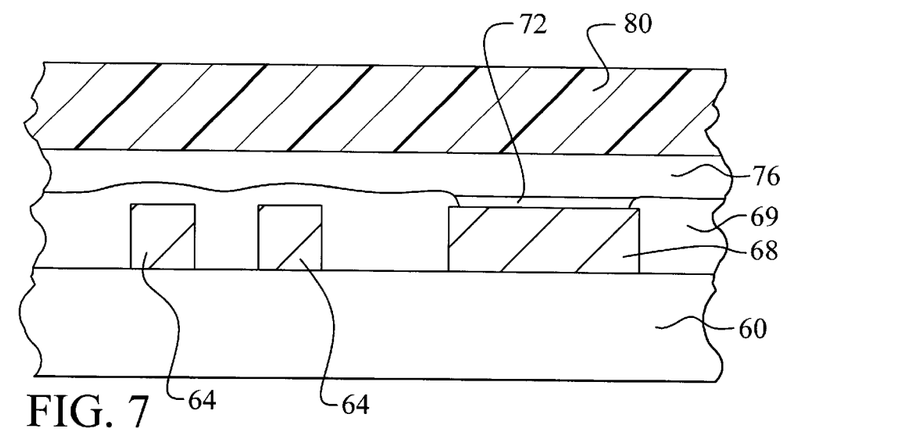

Referring now to FIG. 7, a color filter photoresist layer 80 is deposited overlying the first transparent planarization layer 76. The color filter photoresist layer 80 will be patterned to form color filter elements of a first type. For example, the color image sensor array may comprise filter elements of types green, red, and blue. Each color filter element type requires a different photoresist material to achieve the proper filtering characteristics. The first color filter photoresist layer 80 is preferably deposited to a thickness of between about 1 micron and 2 microns.

Figure 8:
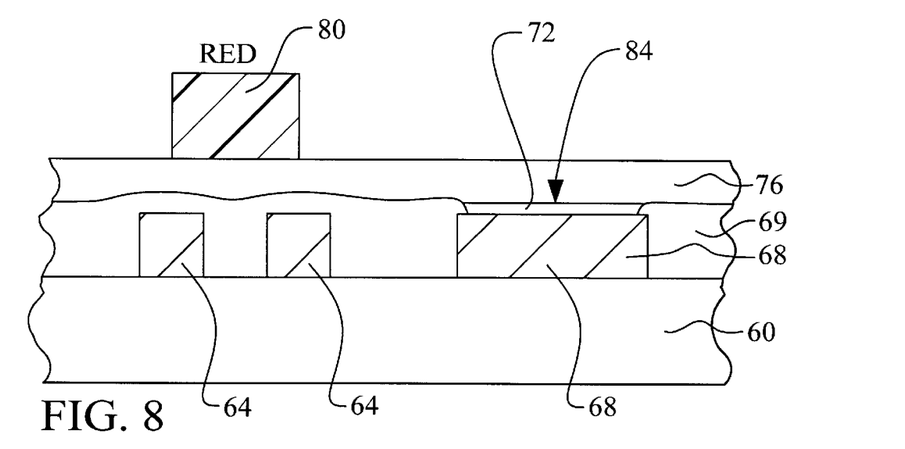

Referring now to FIG. 8, an important feature of the present invention is illustrated. The color filter photoresist layer 80 is patterned to form color filter elements 80 of the first type overlying the first region of the semiconductor substrate 60. The color filter elements 80 are formed to filter the incoming light that strikes a part of the array of cell electrodes 64. The patterning process uses a photolithographic mask to expose a portion of the color filter photoresist layer 80. Following exposure, the color filter photoresist layer 80 is developed to remove the unwanted material. The development process uses an alkaline developer to remove the unwanted photoresist 80.

As in the prior art example, the developer solution can penetrate the planarization layer 76 and cause damage to the bonding pads 68. However, the metal oxide layer 72, formed by the novel method of the present invention, forms a barrier 84 overlying and protected the bonding pad structures 68. The bonding pads 68 are therefore undamaged by the alkaline developer. After development, the color filter elements 80 are baked at a temperature of between about 200 degrees C and 250 degrees C.

Figure 9:
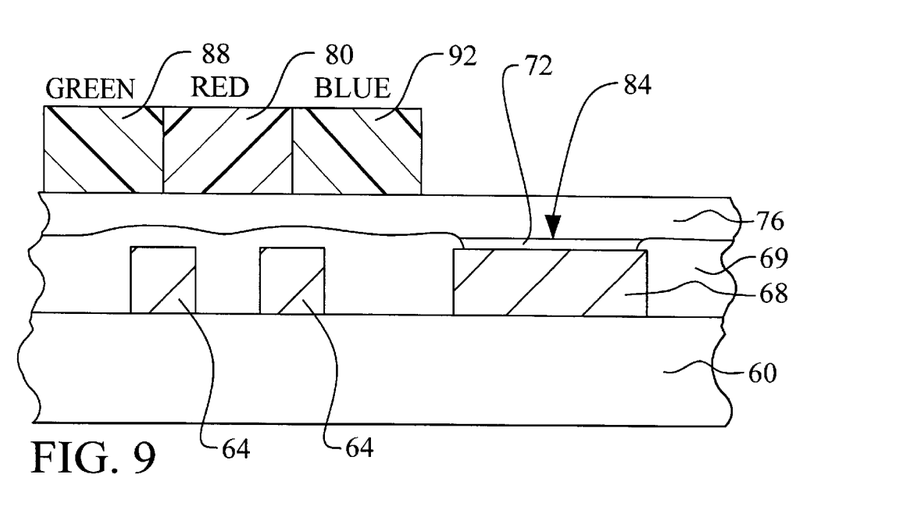

Referring now to FIG. 9, the process used to form the color filter elements 80 of the first type can be repeated to form elements of additional types. In this example, the color elements of the first type 80 are red, the color elements of the second type 88 are green, and the color elements of the third type 92 are blue. Other colors are possible. However, it is not necessary to include all three colors to construct the device. Note that, in the formation of the two additional color filter element types, the presence of the metal oxide layer 72 overlying the bonding pads 68 serves as a barrier 84 to prevent damage to the bonding pads 68 due to exposure to the alkaline developer.

Figure 10:
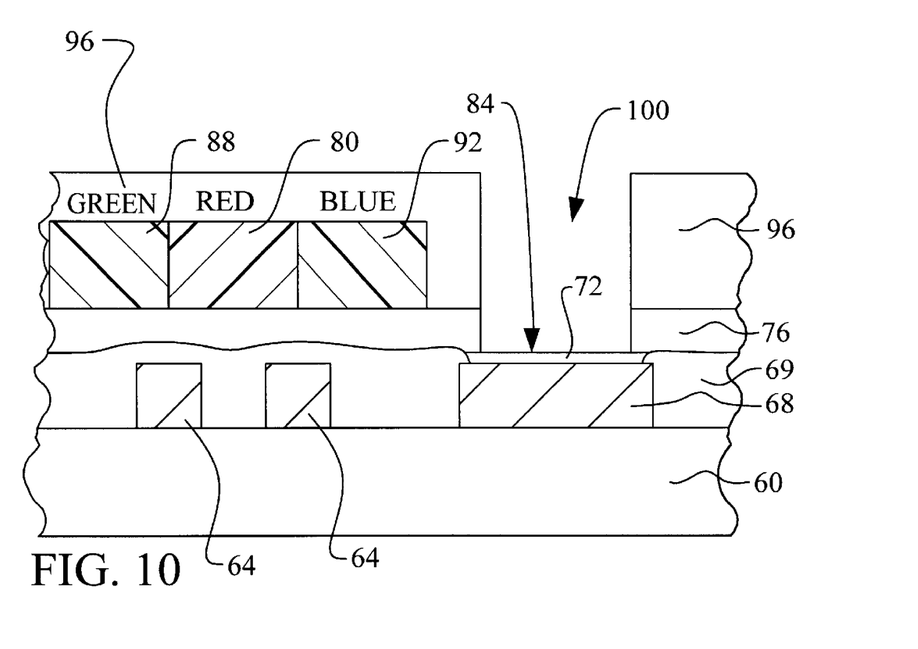

Referring now to FIG. 10, a second transparent planarization layer 96 is deposited overlying the color filter elements 80, 88, and 92 and the first transparent planarization layer 76. The second transparent planarization layer 96 serves two purposes. First, this layer 96 creates a planar surface for the formation of microlens structures above the color filter elements 80, 88, and 92. Second, because this layer 96 is transparent, light is transmitted through the subsequently formed microlens structures and into the color filter elements 80, 88, and 92. The second planarization layer 96 preferably comprises a photosensitive, transparent photoresist material that is deposited to a thickness of between about 1 microns and 2 microns.

The second transparent planarization layer 96 and the first transparent planarization layer 76 are patterned to form bonding pad openings 100 that expose the bonding pads 68. Since the second transparent planarization layer 96 and the first transparent planarization layer 76 comprise photoresist material, the patterning process is once again a photolithographic sequence. Light is exposed to the second transparent planarization layer 96 and the first transparent planarization layer 76 though a photolithographic mask. After exposure, an alkaline developer is used to remove unwanted portions of the second transparent planarization layer 96 and the first transparent planarization layer 76. The bonding pad openings 100 are thereby formed. Note that the alkaline developer could cause damage to the bonding pads 68. However, the presence of the metal oxide layer 72 presents a barrier 84 that prevents bonding pad structure 68 damage.

Figure 11:
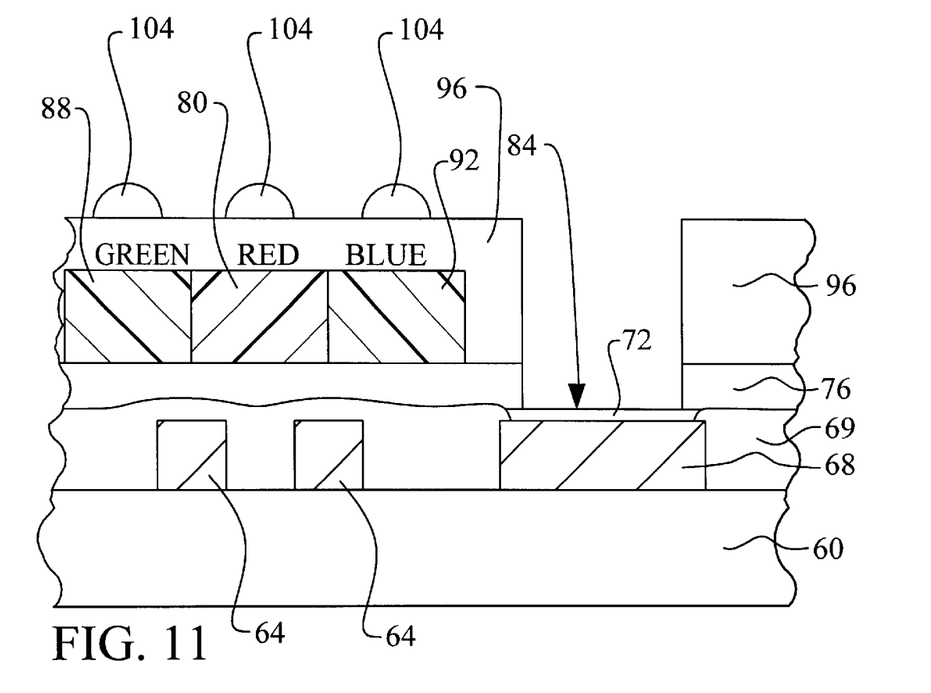

Referring now to FIG. 11, a microlens layer 104 is deposited overlying the second transparent planarization layer 96. The microlens layer 104 preferably comprises an organic, transparent photosensitive material. The microlens layer 104 is preferably deposited to a thickness of between about 1.5 microns and 2.5 microns. The microlens layer 104 is patterned to form microlens elements 104. The patterning process uses a photolithographic mask to expose parts of the microlens layer 104. Following exposure, the microlens layer 104 is developed to remove the unneeded material. The development process uses a alkaline developer. Once again, the presence of the metal oxide layer 72 overlying the bonding pads 68 presents a barrier 84 to the intrusion of the developer. The bonding pad s68 are thereby protected from damage. Finally, the microlens elements 104 are baked to cause rounding and thereby improve the light focusing capability of the microlens elements 104 and to complete the color image sensor in the manufacture of the integrated circuit device.

The novel method of the present invention prevents color filter process damage to the bonding pads. Experimental data confirms the capability of the approach. Gold wire is bonded to the bonding pad structure. The bond strength may be measured using a standard wire pull apparatus. The bondability test criteria is a bond strength of not less than about 30 grams. The preferred embodiment of the present invention achieves measured bond strengths of about 40 grams. By comparison, wafers that receive no treatment, present bond strengths of between about 27 grams and 28 grams. Treating the wafers with CF4 gas has been found to improve the bond strength to about 33 grams. Finally, wafers that do not experience the color filter process demonstrate bond strengths of about 48 grams. While the method of the present invention exhibits bond strengths less than non-color filter devices, it is, nevertheless, a significant improvement over prior art and leads to improved yield and reliability.

As shown in the preferred embodiments, the present invention provides a very manufacturable and effective method to eliminate bonding pad damage due to the color filter process in color image sensor circuits. By dipping the semiconductor wafer in a hydrogen peroxide solution prior to the color filter sequence, an metal oxide layer is formed on the surface of the bonding pad structures. This metal oxide layer presents a barrier to the alkaline developer used in the color filter process. Damage to the pads from the developer is thereby prevented. The method improves bondability of the integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method to form color image sensor cells without damaging bonding pads in the manufacture of an integrated circuit device comprising:

forming cell electrodes and bonding pads on a semiconductor substrate;

forming a passivation layer overlying said cell electrodes but exposing the top surface of said bonding pads;

dipping said semiconductor substrate in a hydrogen peroxide solution to thereby form a metal oxide layer overlying said bonding pads;

depositing a first transparent planarization layer overlying said passivation layer and said metal oxide layer;

depositing color filter photoresist layer overlying said first transparent planarization layer;

patterning said color filter photoresist layer to form color filter elements wherein the presence of said metal oxide layer prevents damage to said bonding pads from an alkaline developer;

thereafter forming second transparent planarization layer overlying said first transparent planarization layer; and thereafter forming microlens elements overlying said second transparent planarization layer to complete said color image sensor cells in the manufacture of the integrated circuit device.

2. The method according to claim 1 wherein said bonding pads comprise one of the group of: aluminum, copper, aluminum-copper alloys, and aluminum-copper-silicon alloys.

3. The method according to claim 1 wherein said hydrogen peroxide solution comprises a solution of hydrogen peroxide and water with a concentration of between about 1:10 and 1:12.

4. The method according to claim 1 wherein said step of dipping said semiconductor substrate in a hydrogen peroxide solution comprises immersion for between about 15 minutes and 20 minutes.

5. The method according to claim 1 wherein said metal oxide layer is formed to a thickness of between about 60 Angstroms and 100 Angstroms.

6. The method according to claim 1 wherein said first transparent planarization layer comprises a photosensitive, photoresist layer.

7. The method according to claim 1 further comprising forming color filter elements of more than one color.

8. The method according to claim 1 wherein said step of forming said second transparent planarization layer comprises:

depositing said second transparent planarization layer overlying said color filter elements and said first transparent planarization layer; and patterning said second transparent planarization layer and said first transparent planarization layer to form bonding pad openings that expose said bonding pads wherein the presence of said metal oxide layer prevents damage to said bonding pads from an alkaline developer.

9. The method according to claim 1 wherein said step of forming said microlens elements comprises:
- depositing a microlens layer overlying said second transparent planarization layer;
- patterning said microlens layer to form said microlens elements wherein the presence of said metal oxide layer prevents damage to said bonding pads from an alkaline developer; and
- baking said microlens elements to round said microlens elements.

10. A method to form color image sensor cells without damaging bonding pads in the manufacture of an integrated circuit device comprising
- forming cell electrodes and bonding pads on a semiconductor substrate wherein said bonding pad structures contain aluminum;
- forming a passivation layer overlying said cell electrodes but exposing the top surface of said bonding pads;
- dipping said semiconductor substrate in a hydrogen peroxide solution to thereby form an aluminum oxide layer overlying said bonding pads;
- depositing a first transparent planarization layer overlying said passivation layer and said aluminum oxide layer;
- depositing color filter photoresist layer overlying said first transparent planarization layer;
- patterning said color filter photoresist layer to form color filter elements wherein the presence of said aluminum oxide layer prevents damage to said bonding pads from an alkaline developer;
- depositing a second transparent planarization layer overlying said color filter elements and said first transparent planarization layer;
- patterning said second transparent planarization layer and said first transparent planarization layer to form bonding pad openings that expose said bonding pads wherein the presence of said aluminum oxide layer prevents damage to said bonding pads from an alkaline developer;
- depositing a microlens layer overlying said second transparent planarization layer;
- patterning said microlens layer to form microlens elements wherein the presence of said aluminum oxide layer prevents damage to said bonding pads from an alkaline developer; and
- baking said microlens elements to round said microlens elements to complete said color image sensor cells in the manufacture of the integrated circuit device.

11. The method according to claim 10 wherein said bonding pads comprise one of the group of: aluminum, aluminum-copper alloys, and aluminum-copper-silicon alloys.

12. The method according to claim 10 wherein said hydrogen peroxide solution comprises a solution of hydrogen peroxide and water with a concentration of between about 1:10 and 1:12.

13. The method according to claim 10 wherein said step of dipping said semiconductor substrate in a hydrogen peroxide solution comprises immersion for between about 15 minutes and 20 minutes.

14. The method according to claim 10 wherein said aluminum oxide layer is formed to a thickness of between about 60 Angstroms and 100 Angstroms.

15. The method according to claim 10 further comprising forming color filter elements of more than one color.

16. The method according to claim 10 wherein said first transparent planarization layer comprises a photosensitive, photoresist layer.

17. The method according to claim 10 wherein said second transparent planarization layer comprises a photosensitive, photoresist layer.

18. A method to form color image sensor cells without damaging bonding pads in the manufacture of an integrated circuit device comprising:
- forming cell electrodes and bonding pads on a semiconductor substrate wherein said bonding pad structures contain aluminum;
- forming a passivation layer overlying said cell electrodes but exposing the top surface of said bonding pads;
- dipping said semiconductor substrate in a hydrogen peroxide solution to thereby form an aluminum oxide layer overlying said bonding pads wherein said hydrogen peroxide solution comprises a solution of hydrogen peroxide and water with a concentration of between about 1:10 and 1:12;
- depositing a first transparent planarization layer overlying said passivation layer and said metal oxide layer;
- depositing color filter photoresist layer overlying said first transparent planarization layer;
- patterning said color filter photoresist layer to form color filter elements wherein the presence of said aluminum oxide layer prevents damage to said bonding pads from an alkaline developer;
- depositing a second transparent planarization layer overlying said color filter elements and said first transparent planarization layer;
- patterning said second transparent planarization layer and said first transparent planarization layer to form bonding pad openings that expose said bonding pads wherein the presence of said aluminum oxide layer prevents damage to said bonding pads from an alkaline developer;
- depositing a microlens layer overlying said second transparent planarization layer;
- patterning said microlens layer to form microlens elements wherein the presence of said aluminum oxide layer prevents damage to said bonding pads from an alkaline developer; and
- baking said microlens elements to round said microlens elements to complete said color image sensor cells in the manufacture of the integrated circuit device.

19. The method according to claim 18 wherein said bonding pads comprise one of the group of: aluminum, aluminum-copper alloys, and aluminum-copper-silicon alloys.

20. The method according to claim 18 wherein said step of dipping said semiconductor substrate in a hydrogen peroxide solution comprises immersion for between about 15 minutes and 20 minutes.

* * * * *